(12) United States Patent
Hurst et al.

(10) Patent No.: US 6,208,043 B1
(45) Date of Patent: Mar. 27, 2001

(54) FAULT ERROR GENERATION IN ELECTRONIC SENSORS

(75) Inventors: David Charles Hurst, Knowle; Kenneth Vincent, Warwickshire, both of (GB)

(73) Assignee: Lucas Industries PLC., Solihull (GB)

( * ) Notice: Subject to any disclaimer, the term of this patent is extended or adjusted under 35 U.S.C. 154(b) by 0 days.

(21) Appl. No.: 09/068,979

(22) PCT Filed: Sep. 29, 1997

(86) PCT No.: PCT/GB97/02683

§ 371 Date: Apr. 16, 1999

§ 102(e) Date: Apr. 16, 1999

(87) PCT Pub. No.: WO98/14790

PCT Pub. Date: Apr. 9, 1998

(30) Foreign Application Priority Data

Oct. 1, 1996 (GB) .................................................. 9620417

(51) Int. Cl.[7] .................................................. G01R 31/28
(52) U.S. Cl. .......................... 307/130; 307/131; 307/125
(58) Field of Search .................................. 340/650, 652, 340/453, 454; 324/503, 511; 188/1.11 E; 307/112, 116, 125, 130, 131

(56) References Cited

U.S. PATENT DOCUMENTS

| 4,293,902 | 10/1981 | White . |
| 4,839,633 | 6/1989 | Krenik . |
| 4,891,973 | 1/1990 | Bollweber et al. . |
| 5,729,208 | * 3/1998 | Ogiwara .............................. 340/652 |
| 6,002,338 | * 12/1999 | Pavlov et al. ........................ 340/650 |
| 6,091,324 | * 7/2000 | Arsenault et al. ................... 340/650 |

FOREIGN PATENT DOCUMENTS

| 44 43 941 | 6/1996 | (DE) . |
| 2 574 508 | 6/1986 | (FR) . |

* cited by examiner

*Primary Examiner*—Fritz Fleming
(74) *Attorney, Agent, or Firm*—Oblon, Spivak, McClelland, Maier & Neustadt, P.C.

(57) ABSTRACT

An output stage for an electronic sensor including two transistors connected in series to a junction therebetween to form a push/pull arrangement relative to a pair of supply lines provided with fixed supply voltages that are different for each line that are connected with different ones of the two transistors. The junction between the two transistors being connected to a sensor output line. Each of the transistors is driven by a respective drive line from an amplifier which receives an input signal corresponding to a sensor input signal. A fault detecting circuit is provided which includes circuitry to detect an open circuit fault condition in either of the two fixed voltage supply lines to disconnect the signal drive line leading to the associated one of the two transistors which is connected to the respective supply line that has been detected to have an open circuit fault. This disconnecting of the drive line from the associated transistor prevents back feed from the sensor output line from being coupled back to through the transistor and its drive line to the electronic sensor.

12 Claims, 2 Drawing Sheets

FAULT ERROR GENERATION IN ELECTRONIC SENSORS

BACKGROUND OF THE INVENTION

1. Field of the Invention

The present invention relates to electronic sensors and is concerned in particular with sensor fault error generation.

2. Discussion of the Background

With the integration of electronics within vehicle control, more and more electronic sensors are required that have a high signal integrity. For this reason, manufacturers have insisted on a minimum quiescent current flowing through all of the sensor connections, even the output pin. It is well known that with low voltage signal connections, a high quiescent current of several milliamperes improves connection reliability. To guarantee this current, the output pin will have either a pull-up or pull-down resistor connected within the monitoring ECU. This output loading resistor has the advantage that if the output connection at the sensor goes open circuit, the monitored signal will be pulled into an error band (ie a voltage level outside the normal sensor operating range), enabling the fault to be detected. In order to supply this increased output current while maintaining a wide voltage swing on the output, it is common for push-pull output stages to be used, consisting of two transistors. FIGS. 1a and 1b of the accompanying drawings show two typical configurations well known in this field.

The aforegoing load resistor, while solving the output open circuit fault, causes other failure detection problems. If, for example, either supply pin is open circuit, it is possible for enough current to flow back into the sensor, via the output pin, to produce an output signal within the normal operating range, therefore making the failure difficult to detect.

SUMMARY OF THE INVENTION

It is an object of the present invention to overcome or mitigate this problem.

In accordance with the present invention, there is provided an output stage for an electronic sensor comprising two transistors connected in series to form a push/pull arrangement between a pair of current supply lines, operating with a fixed supply voltage therebetween, and a sensor output line connected to the junction of these two transistors, each transistor being adapted to be driven via a respective drive line from an amplified sensor input signal, and further comprising a detecting means for detecting an open circuit condition in either of the two supply lines and disabling the signal drive to that one of said two transistors which is connected to that supply line, in a manner so as to prevent back feed from powering the sensor via said sensor output line.

Thus, an output stage in accordance with this invention is provided with a detecting means for detecting an open circuit condition in either supply and disabling the output drive in a manner such as to prevent any back feed from powering the sensor.

A system in accordance with the invention has the advantage that any open circuit connector failure can be detected by the output signal moving into an error band voltage range.

When applied to the particular context of a brake pad wear sensor, the present invention can be used to detect the failure of either of the supply lines into the sensor and disable the output drive stage to inhibit any reverse current flow from the output pin, causing the output voltage to stay within its normal operating band.

Advantageously, the detecting means comprises a switch which is responsive to a voltage difference between two circuit points arising in the presence of an open circuit supply condition.

In some embodiments, the detecting means can comprise two switches, each of which is responsive to a voltage difference between two circuit points arising in the presence of an open circuit condition in a respective one of said two supply lines.

Advantageously, said sensor output line is coupled via respective resistors to opposite terminals of a second voltage supply source.

BRIEF DESCRIPTION OF THE DRAWINGS

The invention is described further hereinafter, by way of example only, with reference to the accompanying drawings, in which.

DISCUSSION OF THE PREFERRED EMBODIMENTS

Figure 1B:
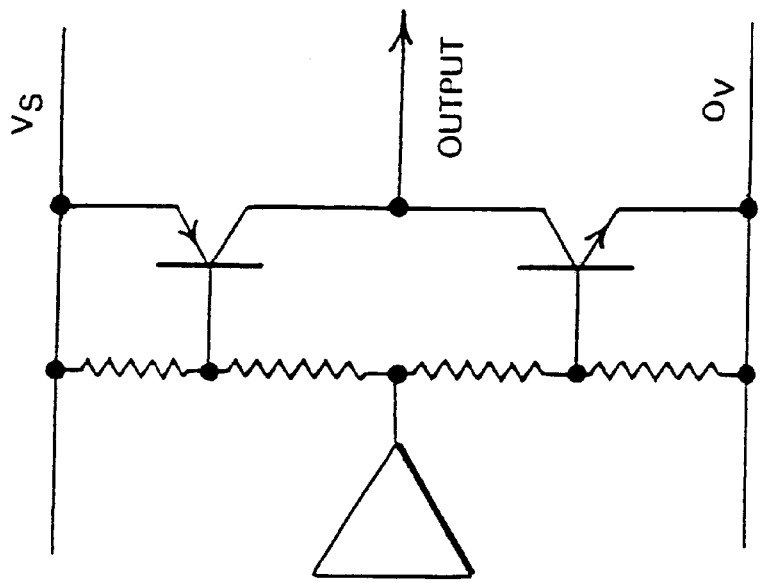
FIGS. 1a and 1b illustrate known circuits.
Figure 1A:
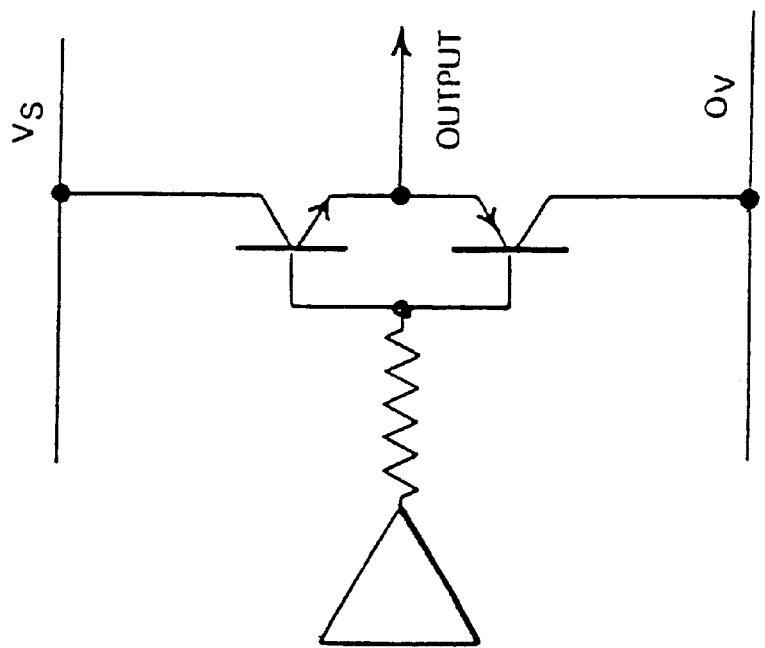

The operation will be described with reference to FIG. 2 although it could be applied to either circuit of FIG. 1 and to many other output stage configurations.

Figure 2:
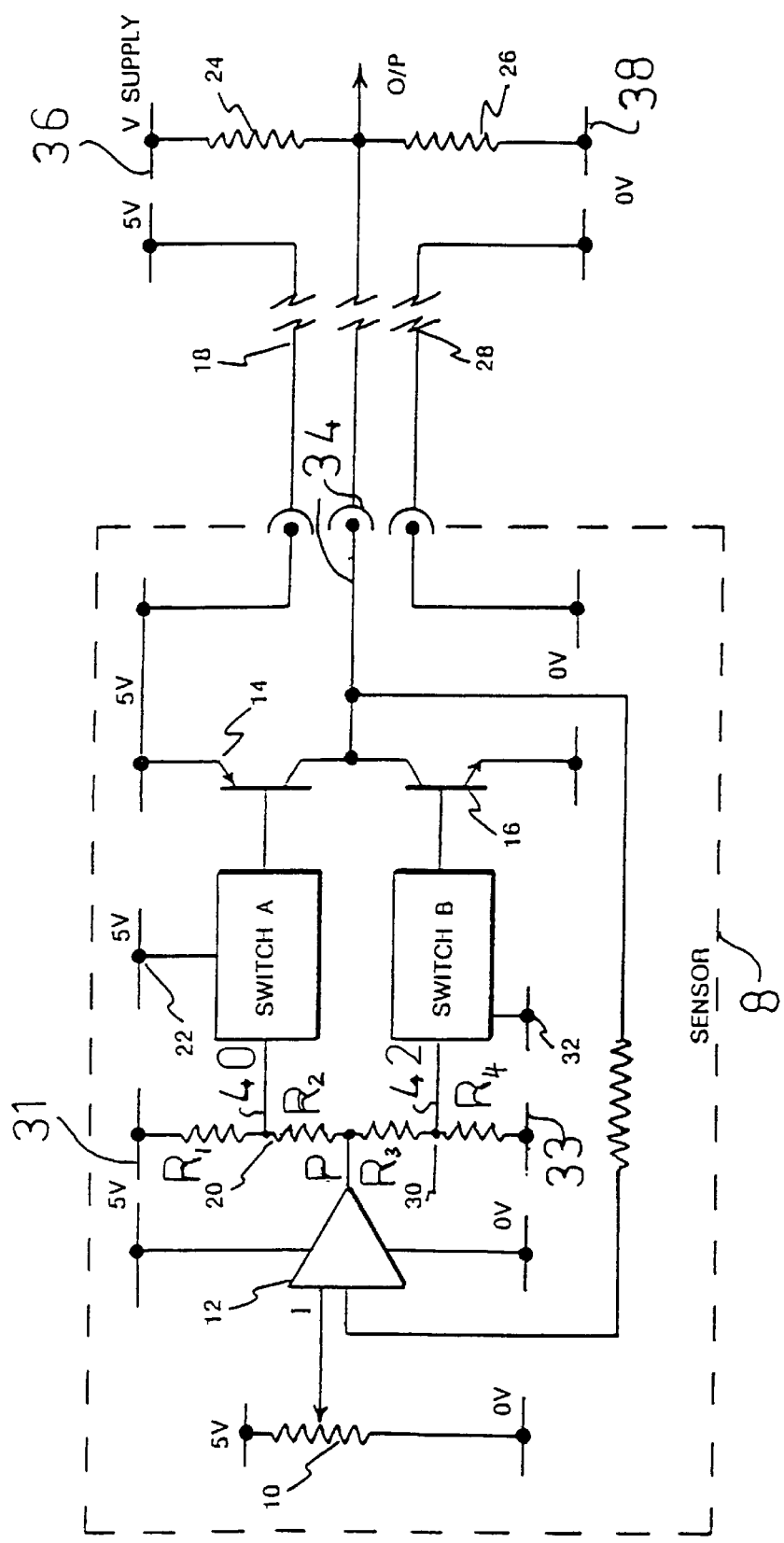
FIG. 2 illustrates one embodiment of a circuit in accordance with the present invention, applied to a pad wear sensor of a vehicle brake control system.

FIG. 2 shows a sensor 8 in which an input signal 1 from a variable resistor 10 connected across a voltage supply is buffered by an amplifier 12, the output signal P from the amplifier 12 driving an output stage, comprising two output transistors 14,16, via a series resistor network $R_1, R_2, R_3, R_4$ connected between first voltage supply rails 31, 33. These parts together form a buffer that can provide the output current required for the sensor on a line 34 and will allow the output to swing quite close to the supply rails. The output line/pin 34 of the sensor is connected to the junction of pull-up and pull-down resistors 24, 26 connected in series between second voltage supply lines 36, 38 externally of the sensor 8.

Under an open circuit supply connection 18 in the line 31, a first switching element A detects a voltage reduction between points 20 and 22 via an input line 40. This voltage reduction is arranged to open the switching element A by means of conventional switching circuitry, known per se, to stop any back feed via the output line/pin 34 from powering the circuit, therefore reducing current drawn from the pull-up resistor 24. This action will hold the output signal outside its normal operating range.

The sensor 8 is required to operate with the pull-down resistor 26 as part of the output load. Under these conditions, a failure of the $O_v$ connection 28 (line 33) is arranged to be detected by a second switching element B via an input line 42. A reduction in voltage between points 30 and 32 is arranged to be detected and switching element B to be opened. This action, as with switching element A, will stop any back feed from the pull-down resistor 26 providing a return path for the sensor power, thereby maintaining the output signal outside its operating band.

What is claimed is:

1. An output stage for an electronic sensor, comprising:
    two transistors connected in a series push/pull arrangement between a pair of supply lines to provide an output to a sensor output line connected to a junction between said two transistors;

a first voltage supply source connected to the pair of supply lines to provide each supply line with a different fixed supply voltage;

two drive lines, each respective drive line being connected to an output from an amplifier configured to amplify a sensor input signal; and a fault detecting circuit connected between the amplifier output and the two drive lines, said fault detecting circuit being connected to detect an open circuit condition between the first voltage supply source and either of the two supply lines and to disconnect the drive line connected to an associated one of said two transistors which is connected to the supply line having the open circuit fault condition so as to prevent back feed from powering the electronic sensor via said sensor output line and the associated one of said two transistors.

2. The output stage as claimed in claim 1, wherein the fault detecting circuit comprises a first switching element configured to be responsive to a voltage difference between two fault detecting circuit points caused by said open circuit fault condition.

3. The output stage as claimed in claim 1, wherein the fault detecting circuit comprises two switching elements, each switching element being configured to be responsive to a voltage difference between two fault detecting circuit points caused by said open circuit fault condition in a respective one of said two supply lines.

4. The output stage as claimed in claim 1, wherein the electronic sensor is a brake pad wear sensor, and said amplifier is a buffer amplifier connected to receive an input signal from a variable resistor as said sensor input signal.

5. The output stage as claimed in claim 1, wherein said sensor output line is coupled via respective resistors to opposite terminals of a second voltage supply source.

6. The output stage as claimed in claim 2, wherein the electronic sensor is a brake pad wear sensor, and said amplifier is a buffer amplifier connected to receive an input signal from a variable resistor as said sensor output signal.

7. The output stage as claimed in claim 3, wherein the electronic sensor is a brake pad wear sensor, and said amplifier is a buffer amplifier connected to receive an input signal from a variable resistor as said sensor input signal.

8. The output stage as claimed in claim 2, wherein said sensor output line is coupled via respective resistors to opposite terminals of a second voltage supply source.

9. The output stage as claimed in claim 3, wherein said sensor output line is coupled via respective resistors to opposite terminals of a second voltage supply source.

10. The output stage as claimed in claim 4, wherein said sensor output line is coupled via respective resistors to opposite terminals of a second voltage supply source.

11. The output stage as claimed in claim 6, wherein said sensor output line is coupled via respective resistors to opposite terminals of a second voltage supply source.

12. The output stage as claimed in claim 7, wherein said sensor output line is coupled via respective resistors to opposite terminals of a second voltage supply source.

* * * * *